United States Patent [19]

Birrittella et al.

[11] Patent Number: 4,635,087
[45] Date of Patent: Jan. 6, 1987

[54] MONOLITHIC BIPOLAR SCR MEMORY CELL

[75] Inventors: Mark S. Birrittella, Phoenix; Walter C. Seelbach, Fountain Hills, both of Ariz.

[73] Assignee: Motorola, Inc., Schaumburg, Ill.

[21] Appl. No.: 687,530

[22] Filed: Dec. 28, 1984

[51] Int. Cl.[4] ............... H01L 29/74; H01L 27/02; H01L 29/72; G11C 11/34
[52] U.S. Cl. .................................. 357/38; 357/46; 357/44; 357/36; 365/180
[58] Field of Search ............... 357/38, 46, 92, 44, 357/36; 365/180

[56] References Cited

U.S. PATENT DOCUMENTS 3,898,483  8/1975  Sander et al. ............... 357/44

FOREIGN PATENT DOCUMENTS 0067581  6/1977  Japan ............... 357/92
0199256  12/1982  Japan ............... 357/92

OTHER PUBLICATIONS

Streetman, Solid State Electronic Devices, 2nd ed., 1980, pp. 404–407.
Malaviya, Single Device DC Stable Memory Cell, IBM Tech. Disclosure Bulletin, vol. 20, No. 9, 1978, pp. 3492–3494.

Primary Examiner—J. Carroll
Assistant Examiner—R. P. Limanek
Attorney, Agent, or Firm—Robert M. Handy

[57] ABSTRACT

Bipolar memory arrays having lower quiescent leakage and higher switching speed are constructed by using coupled SCRs formed from vertical PNP and NPN devices. Buried collectors for the PNP and NPN devices are provided within the same isolation tub. A P type plug is used to connect the P collector of the PNP to the P base of the NPN in a region where the P base and P collector overlap. A single N epi-region serves as the base of the PNP and the collector of the NPN. The P plug is located within this N epi-region but part of the N epi-region adjacent to or around the P plug is left so that internal connection of the PNP base and NPN collector is not cut off by the P plug. The structure is particularly suited for use in large memory arrays. The method of fabrication is also described.

9 Claims, 10 Drawing Figures

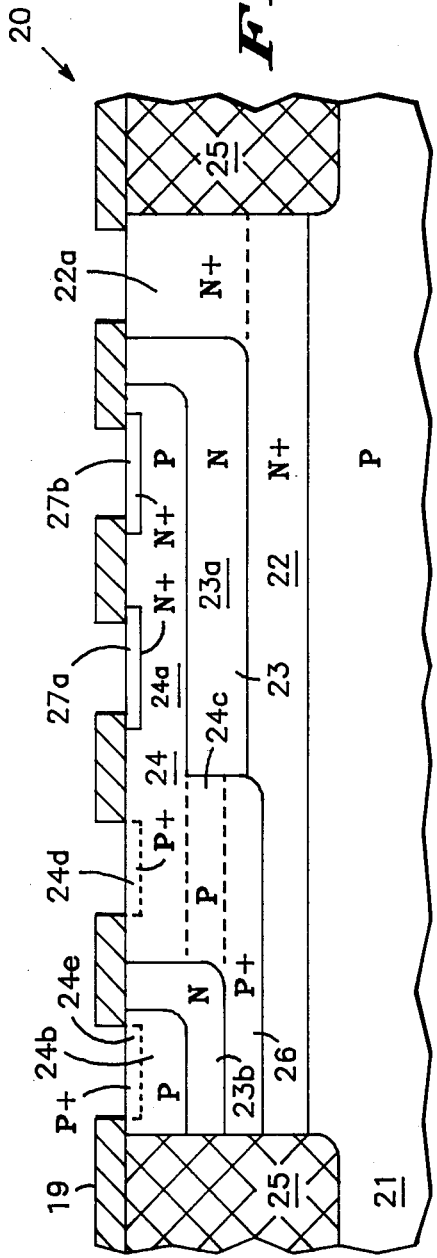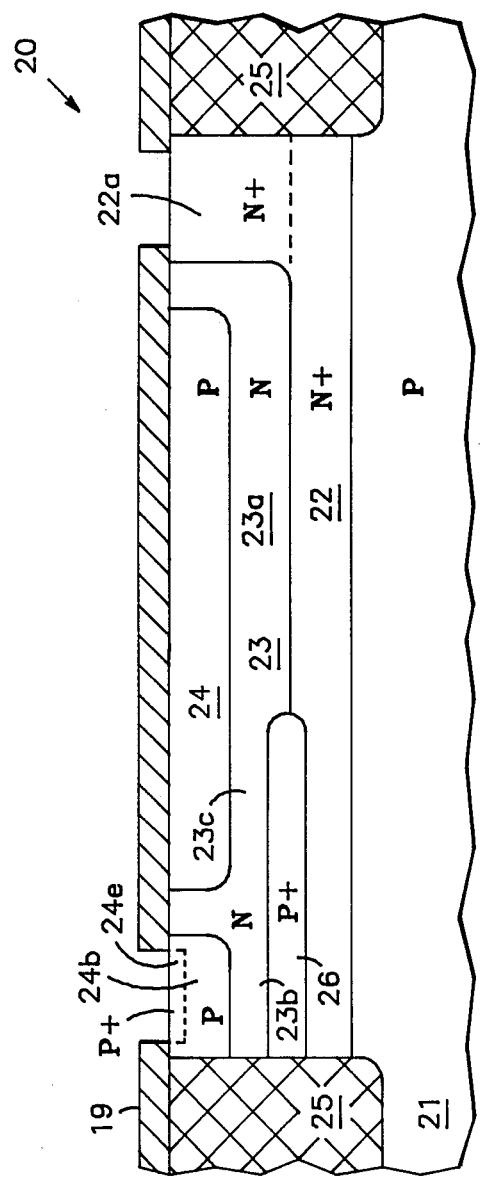

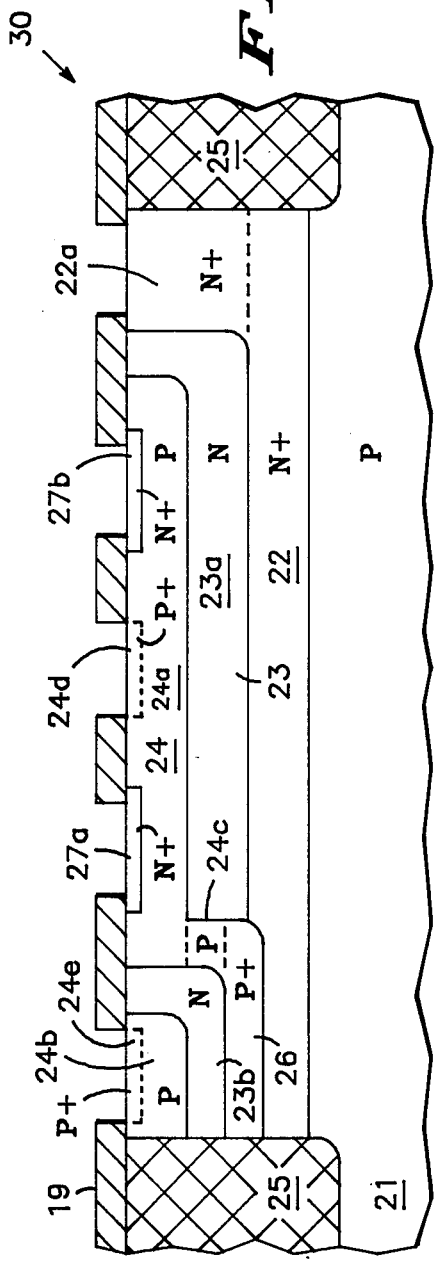
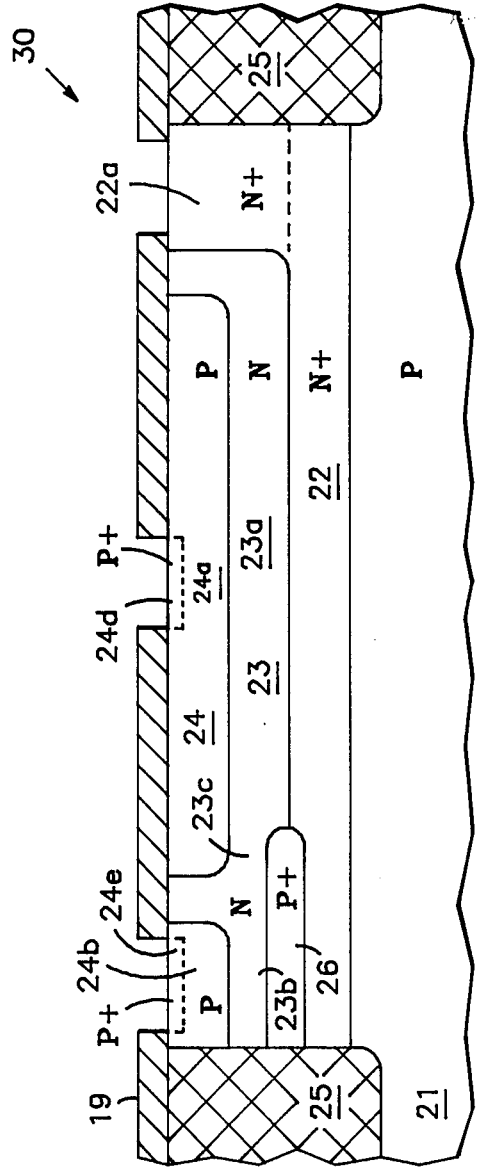
FIG. 3B
FIG. 3C

MONOLITHIC BIPOLAR SCR MEMORY CELL

BACKGROUND

1. Field of the Invention

This invention relates to semiconductor memories and, more particularly, to means and methods for providing integrated bipolar SCR devices and circuits for memory arrays.

2. Background Art

It is commonplace in the semiconductor art to form SCR like devices using coupled complementary bipolar transistors. These SCR's are cross-coupled to form a bi-stable storage cell. Large numbers of such storage cells are placed in an addressable array to form a memory. Tens of thousands of such cells are often used in a single memory array.

The SCR is composed a PNP and a NPN device wherein the collector of one transistor is formed in the same region as the base of the other transistor. In the bipolar integrated circuit art, the NPN device is usually formed as a vertical transistor and the PNP is usually formed as a lateral transistor. This arrangement gives switching action even though the gain of the lateral PNP is not large since it is only necessary that the product of the common emitter current gains of the device pair be equal to or greater than one.

While the lateral-vertical device arrangement is useful for memory cells, it suffers from a number of disadvantages. Among these are the fact that the lateral device, e.g., the PNP, injects a small amount of current into the substrate. A parasitic PNN+P transistor exists between the P injector or emitter of the lateral PNP and the underlying P substrate on which all of the devices are built. While the presence of the intervening N+ region reduces the gain of this parasitic device to a small value, there is still a finite amount of conduction to the substrate through this parasitic device. Where only a few lateral PNP devices are used, this leakage current is not troublesome. However, in large memory arrays employing thousands or tens of thousands of devices, the sum of the small parasitic leakage currents of the many lateral PNP devices can account for a substantial fraction of the quiescent power loss in the memory array. A further limitation of prior art lateral devices is their high charge storage. Charge storage undesirably increases switching time so that memory speed is less than what is desired. Thus a need still exists for improved device structures which reduce or substantially eliminate excess charge storage and leakage current.

One way to reduce the parasitic action is to replace the lateral device with a vertical device. However, prior art arrangements for accomplishing this in integrated circuits have all required the use of isolating structures between the vertical PNP and vertical NPN, such as trenches, oxide filled moats, or additional diffused regions. These isolation structures increase the semiconductor area required for implementing the memory cell. Since many thousands of memory cells may be required in a single semiconductor die, device structures which occupy increased area are not desirable. Further, it is important that the device structure be easy to fabricate and not require the addition of many more process steps, as is the case with prior art trench structures or dielectric isolation structures. Thus a need continues to exist for improved memory cell structures which do not require additional isolation walls and large increases in device area, and which can be fabricated using inexpensive and convenient process steps.

Accordingly, it is an object of the present invention to provide improved latching devices and memory cell structures which do not depend on lateral devices.

It is a further object of the present invention to provide improved latching devices with reduced charge storage and substrate leakage current.

It is an additional object of the present invention to provide improved SCR latching devices formed from vertical PNP and NPN devices in the same monolithic substrate.

It is a further object of the present invention to provide an improved SCR latching device without isolation walls between the coupled PNP and NPN devices forming the latching device.

It is an additional object of the present invention to provide improved latching devices which can be conveniently arranged in pairs to provide bi-stable memory cells.

It is a further object of the present invention to provide the above latching devices and bi-stable memory cells in a minimum area.

It is an additional object of the present invention to provide an improved method for fabrication of the above device and cell structures.

For convenience, the present invention is illustrated for the case of devices and circuits built on P type substrates. Those of skill in the art will understand that N type substrates could equally well be used, in which case the illustrated device regions would have conductivity types opposite those shown.

SUMMARY OF THE INVENTION

These and other objects and advantages are provided by the present invention wherein, a vertical PNP and vertical NPN are used for the coupled transistor pair forming the SCR. A P+ collector is provided for the vertical PNP which is internally tied to the base of the vertical NPN. An N+ subcollector is provided for the NPN. A common N region is used to form the base of the PNP and the collector of the NPN. Unlike many prior art structures for forming complementary vertical devices, the invented structure uses no isolation walls or metallic interconnections between the PNP and NPN devices making up the SCR. Each SCR is contained within a single isolation tub. Pairs of these integrated SCRs are interconnected to make up a memory cell.

When a P type substrate is used, for example, it has thereon an N+ buried collector, covered in turn with an N type epi-regio which serves as the collector of a vertical NPN device and the base of a vertical PNP device. The collector of the vertical PNP device is formed from a buried P+ region which underlies the N epi-region and overlies the N+ buried collector. A P type base for the vertical NPN is placed in the N epiregion over the N+ buried collector. A portion of the P-base overlaps the P+ buried collector for the vertical PNP. The P type emitter or injector of the vertical PNP is formed in the N epi-region over the P+ buried collector. This P type injector or emitter region for the vertical PNP is preferably formed at the same time as the P type base of the vertical NPN. In order for the PNP and NPN to be coupled to form an SCR, the P+ collector of the PNP must be tied to the P type base of the NPN and the N type base of the PNP must be tied to the N type collector of the NPN. This is accomplished in the present invention by placing the two devices side by side in a common N type region surrounded by an isolation moat extending to the substrate and with an overlap region between the NPN base and the PNP collector. An internal P type plug of limited lateral area is provided through the N epi-region from the P base to the P+ buried collector in the overlap region. This couples the P base and P+ collector together. It is essential that the P-plug not extend across the device from isolation wall to isolation wall since the N base region of the PNP must remain coupled to the N collector region of the NPN around or between the P type plug. The P plug is conveniently formed by ion implantation at sufficient energy to insure that it is formed beneath the device surface in the N region where the P base and P+ collector overlap. The invented means permits the PNP and NPN devices to be formed in a single isolation tub. Multiple tubs may be conveniently arranged in a side-by-side fashion to permit economical constriction of cross-coupled devices for memory cells.

BRIEF DESCRIPTION OF THE DRAWINGS

FIG. 2B shows a simplified cross-sectional view in schematic form of the device of FIG. 2A;

FIG. 2C shows a further simplified cross-sectional view in schematic form of the device of FIG. 2A;

FIG. 3B shows a simplified cross-sectional view in schematic form of the device of FIG. 3A;

FIG. 3C shows a further simplified cross-sectional view in schematic form of the device of FIG. 3A;

DETAILED DESCRIPTION OF THE DRAWINGS

Figure 1:
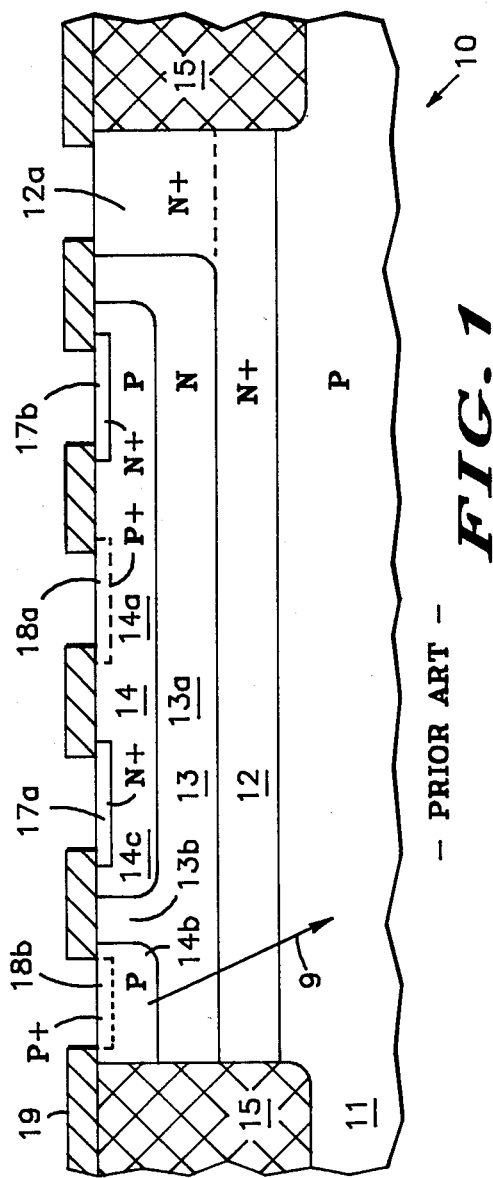
FIG. 1 shows in simplified and schematic form a cross-section through an SCR device formed from a lateral PNP and vertical NPN device, according to the prior art.

FIG. 1 shows a cross-section through SCR device 10 formed from a lateral PNP and a vertical NPN transistor according to the prior art. Two such SCR devices are combined according to the circuit of FIG. 4 to form a memory cell. SCR 10 comprises P type substrate 11, buried N+ collector region 12, N type collector region 13, P type base region 14 having parts 14a and 14b, and N+ emitter regions 17a and 17b. P+ regions 18a-b are provided in P regions 14a-b to facilitate contact thereto. The lateral PNP transistor is formed from P region 14b which functions as emitter or injector $E_{11}$ (see FIG. 4), portion 13b of N region 13 which functions as base $B_{11}$, and portion 14c of P region 14 which functions as collector $C_{11}$.

The vertical NPN transistor in FIG. 1 is formed from N+ regions 17a-b which act as emitters $E_{21}$ and $E_{22}$, P region 14a which functions as base $B_{21}$, and N type portion 13a of region 13 which functions as collector $C_{21}$. Buried collector 12 and collector contact 12a are used to reduce the series collector resistance. Surface dielectric layer 19 is provided over the surface of device 10 with contact holes to permit access for external connections.

Figure 4:
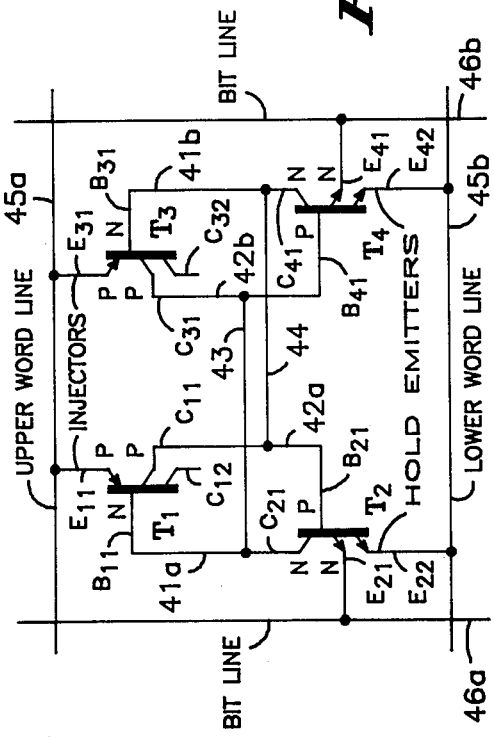
FIG. 4 shows a schematic drawing of an electrical circuit for a memory cell employing cross coupled SCR devices.

A parasitic vertical PNN+P device is formed by regions 14b, 13, 12, and 11. This is indicated in FIG. 4 by collector $C_{12}$. Leakage current indicated by arrow 9 in FIG. 1 flows to substrate 11. The substrate leakage current of a single device may be small. However, when many devices are used in a large memory array the sum of the leakage currents can be large and amount to a substantial fraction of the quiescent power dissipation of the array. It is highly desirable to be able to reduce this leakage current with little or no increase in device area.

Figure 2A:
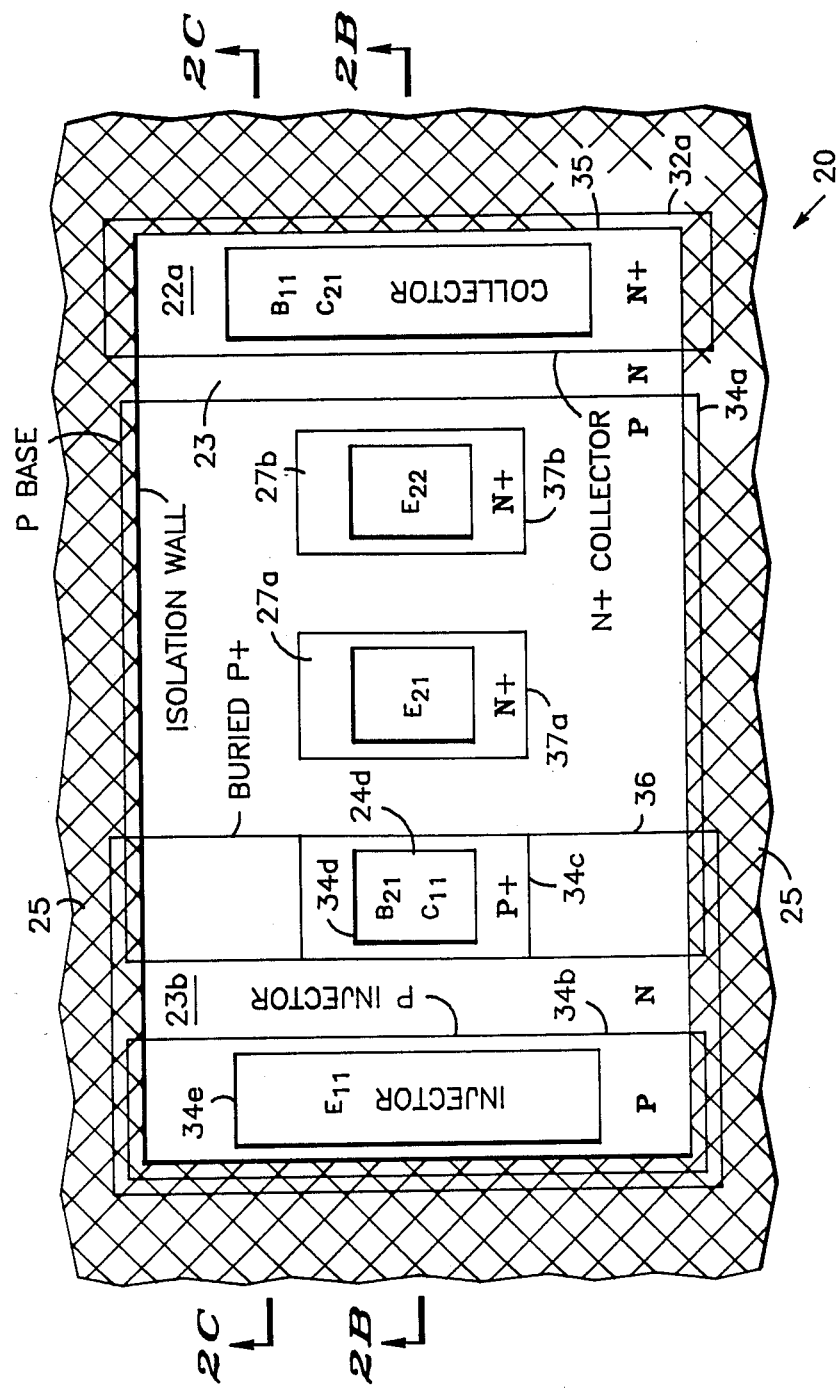
FIG. 2A shows a simplified plan view of the layout of an SCR device formed from a vertical PNP and vertical NPN transistor according to the present invention.

FIG. 2A shows a simplified plan view of the layout of SCR 20 formed from a vertical PNP and vertical NPN transistor according to the present invention. FIGS. 2B-C show cross-sections through the device of FIG. 2A, along different lines as indicated in FIG. 2A. The mask outlines used to form the device regions visible on FIGS. 2A-C are indicated on FIG. 2A, and explained in more detail later. The device regions corresponding to the circuit elements of FIG. 4 are also shown in FIG. 2A.

Referring now to FIGS. 2A-C, P type substrate 21 has formed thereon buried N+ collector region 22. Region 26 which is heavily doped P+, is formed on a portion of layer 22. N type layer 23 having portions 23a-c covers regions 22 and 26. P type region 24 having separated parts 24a and 24b is formed in N type region 23. Part 24a of region 24 and buried collector region 26 overlap and are coupled by P type plug 24c, as shows in FIG. 2B. This accomplishes connection 42a shown in FIG. 4, internal to device 20 and without need for surface (e.g. metal) interconnections. P type plug 24c has limited lateral extent and does not extend across device 20 to oxide isolation region 25, as can be seen by comparing the different cross-sectional views of FIG. 2B and 2C. This provides coupling internal to device 20 between portions 23b and 23a of N region 23 via portion or portions 23c. This accomplishes connection 41a shown in FIG. 4 without use of interconnections external to the semiconductor body, as for example metal interconnections on the surface. N+ regions 27a-b and P+ regions 24d-e are provided in region 24. The surface of the device is covered by conventional dielectric passivation layer 19 having openings therein to permit contact to the device regions.

In terms of the circuit shown in FIG. 4, PNP transistor $T_1$ is formed from region 24b, including contact portion 24e, which serves as P type emitter or injector $E_{11}$, region 23b which corresponds to base $B_{11}$, and P+ region 26 which serves as collector $C_{11}$. Collector $C_{12}$ indicates the parasitic substrate collector. NPN transistor $T_2$ is formed from N+ regions 27a and 27b which act as emitters $E_{21}$ and $E_{22}$. Either of regions 27a or 27b may be chosen to function as emitter $E_{21}$ and the other for emitter $E_{22}$, the choice being based on interconnection convenience when two such SCRs are interconnected to form a memory cell. P region 24a serves as base $B_{21}$, and N region 23a serves as collector $C_{21}$ of transistor $T_2$. Internal connection 42a is provided by region 24c. It is desirable that region 24c be relatively heavily doped to minimize its series resistance. Device 20 is laterally surrounded by isolation region or wall 25.

A dielectric oxide is conveniently used for isolation wall 25. N+ subcollector 22 and collector contact 22a are provided to reduce collector resistance in the NPN device and improve switching speed.

A feature of the present invention is that P+ collector 26 reduces the volume of N or N+ material in base region 23b of the PNP transistor. The arrangement of FIGS. 2A-C using a vertical PNP transistor is to be compared with the prior art arrangement using a lateral PNP transistor illustrated in FIG. 1, wherein the portion of N type region 13 forming the base of the lateral PNP communicates directly with the portion of N+ region 12 underlying P regions 14b and 14c. With the present invention, P+ region 26 shields N type base region 23b of the vertical PNP from N+ region 22. Also, for the same thickness of the N type epi-layer used to provide N region 13 in FIG. 1 or N region 23 in FIGS. 2A-C, the thickness of N region 13 under the lateral PNP in FIG. 1 is greater than the thickness of N region 23b in FIGS. 2B-C. This is because P+ region 26 is formed in a portion of the N type layer used to provide region 23. This reduces the thickness of the N layer remaining in region 23b. Thus, the arrangement of the present invention, as illustrated in FIGS. 2A-C, reduces the volume of N or N+ type material in or adjacent to the base of the PNP device. This reduces the amount of charge stored in the PNP device during operation thereby reducing the switching time. Accordingly, in a memory employing the structure of the present invention the switching speed is improved as compared to prior art memories employing lateral devices.

Figure 3A:
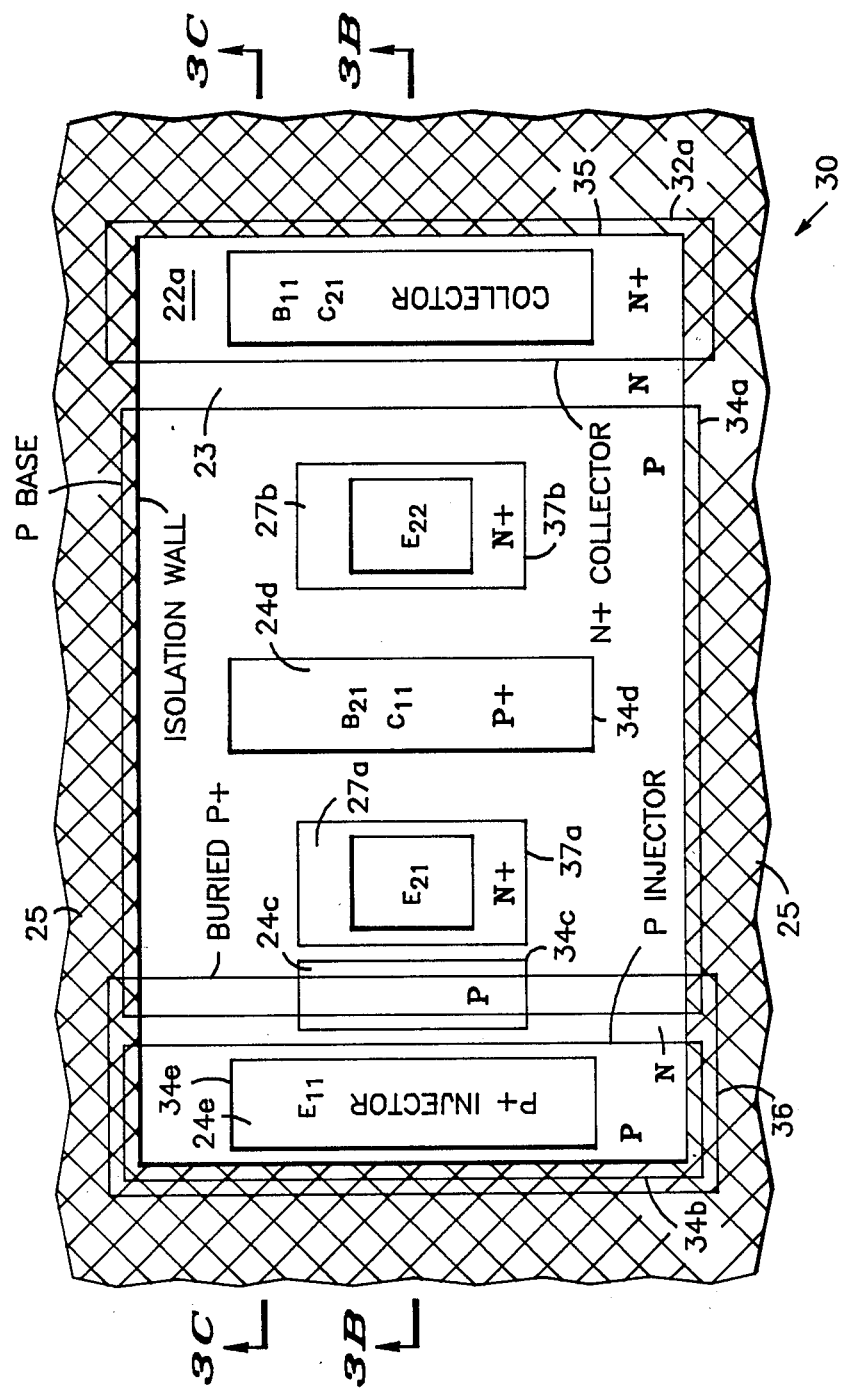
FIG. 3A shows a simplified plan view of the layout an SCR device formed from a vertical PNP and vertical NPN transistor according to a further embodiment of the present invention.

FIGS. 3A-C, are illustrations similar to FIGS. 2A-C, but of a further embodiment of the present invention. FIG. 3A is a simplified plan view and FIGS. 3B-C are simplified schematic cross-sectional views. FIGS. 3A-C differ from FIGS. 2A-C in that P+ region 24d is not located over plug 24c, but is placed more centrally on base region 24a, between emitter regions 27a-b. This requires a slightly larger layout area because of the additional alignment tolerance which must be provided but is more convenient for contact purposes when two SCR cells are combined to make a memory cell as part of an array. The functions of the various regions in FIGS. 3A-C are the same as in FIGS. 2A-C and they have the same correspondence to the circuit of FIG. 4.

FIG. 4 shows a schematic diagram of a memory cell formed from two SCRs. A first SCR is formed from PNP transistor $T_1$ and NPN transistor $T_2$ which are coupled together as indicated by connections 41a and 42a. A second SCR is formed from PNP transistor $T_3$ and NPN transistor $T_4$ which are coupled together as indicated by connections 41b and 42b. The SCRs are coupled by lines 43 and 44 to form a bi-stable memory cell. Emitters or injectors $E_{11}$ of transistor $T_1$ and $E_{31}$ of transistor $T_3$ are connected to upper word line 45a. Emitters $E_{22}$ of transistor $T_2$ and $E_{42}$ of transistor $T_4$ are connected to lower word line 45b. Emitter $E_{21}$ of transistor $T_2$ is connected to bit line 46a and emitter $E_{41}$ of transistor $T_4$ is connected to bit line 46b. Collectors $C_{12}$ of transistor $T_1$ and $C_{32}$ of transistor $T_3$ indicate the parasitic substrate collector indicated in the cross-sections of FIGS. 2B-C and 3B-C. The operation of the circuit of FIG. 4 is well understood by those of skill in the art. The correspondence between the emitters, collectors, and bases shown in the schematic of FIG. 4 and the device regions of FIGS. 2A-C and 3A-C has already been described and is further illustrated in connection with FIG. 5.

Figure 5:
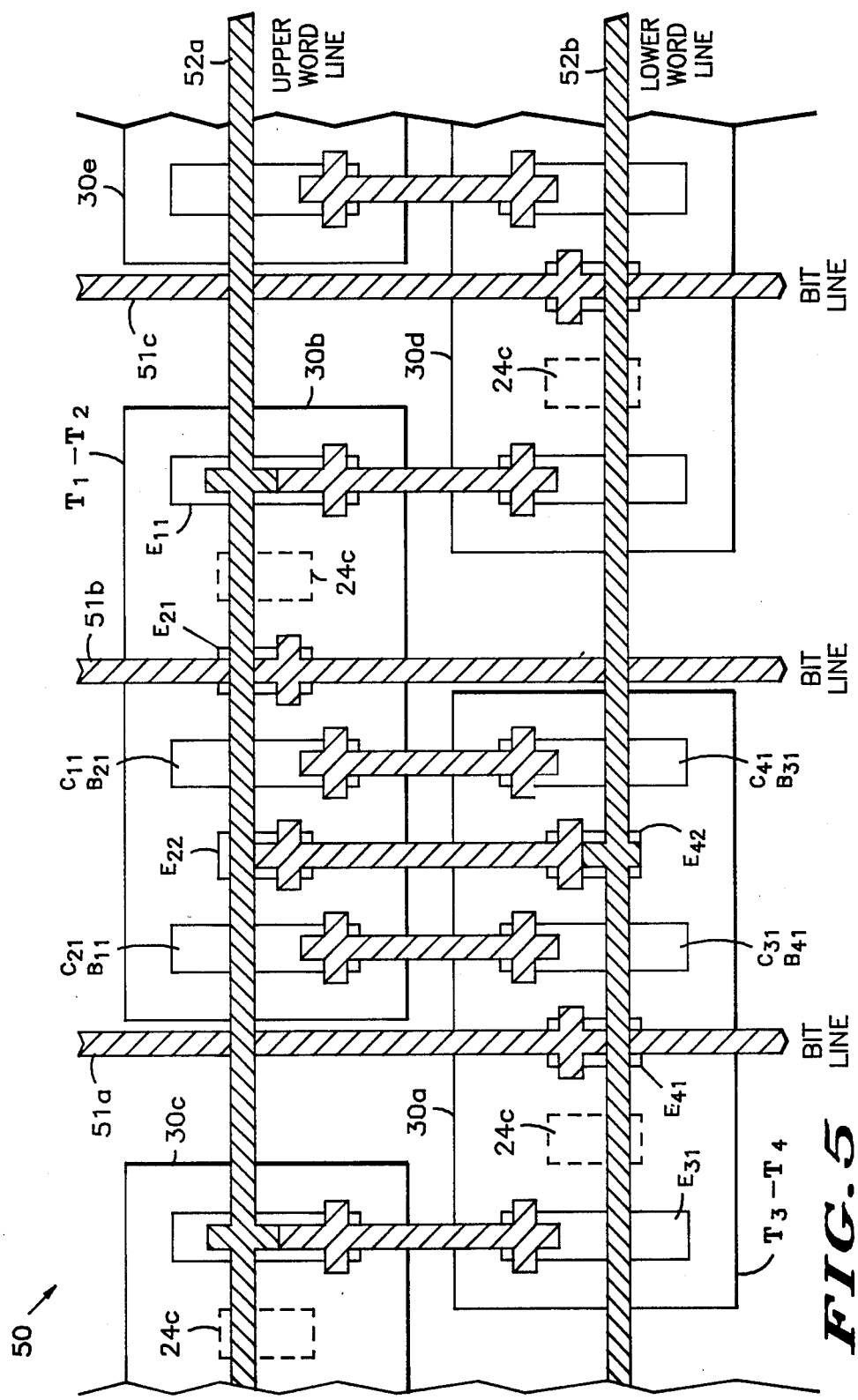
FIG. 5 shows a plan view in simplified and schematic form of the layout of the memory circuit of FIG. 4, according to the present invention.

FIG. 5 shows a plan view in simplified form of the layout of memory cell 50, embodying the circuit of FIG. 4 and according to the present invention. It will be understood by those of skill in the art that FIG. 5 shows only a small portion of a complete memory chip which, in practice, has many such portions duplicated in both vertical and horizontal directions to form a memory array of the desired size. To aid in the understanding of FIG. 5, the surface dielectric layers have been assumed to be transparent and the cross-hatching used to indicate dielectric isolation walls 25 in FIGS. 2A-C and 3A-C has been omitted. SCRs 30a-e of FIG. 5 correspond to SCR 30 in FIGS. 3A-C and, other than their azimuthal orientation, are substantially identical. Those of skill in the art will understand that the layout of FIG. 2A-C could also be used, with a corresponding rearrangement of the metal interconnections. For simplicity, individual SCRs 30a-e are shown in outline with only the device contact areas and buried P plug 24c indicated. The device areas of transistor pairs $T_1$-$T_2$ and transistor pairs $T_3$-$T_4$ are labeled to indicate their correspondence to the circuit of FIG. 4 and the layout and internal structure of FIGS. 3A-C. For clarity, the first level metal interconnections for the memory cell are drawn shaded and the second level metal interconnections are shown solid. Crosses are used to indicate where there is a connection between the metal layers and the underling device region or the first metal layer.

It can be seen that the arrangement of device regions and SCR orientations shown in FIG. 5 provide a particularly compact memory cell arrangement which is well suited to large memory arrays. Each row of SCRs is flipped 180 degrees with respect to the adjacent row. Also, each SCR in one row is displaced horizontally with respect to the adjacent row by an amount approximately equal to the spacing of the P+ contacts. This allows the bit line intended to contact the intervening N+ emitter to pass between the ends of the adjacent SCRs. The arrangement depicted in FIG. 5 is particularly suitable for forming large memory arrays in a relatively small chip area and with largely rectilinear word and bit lines.

Figure 6:
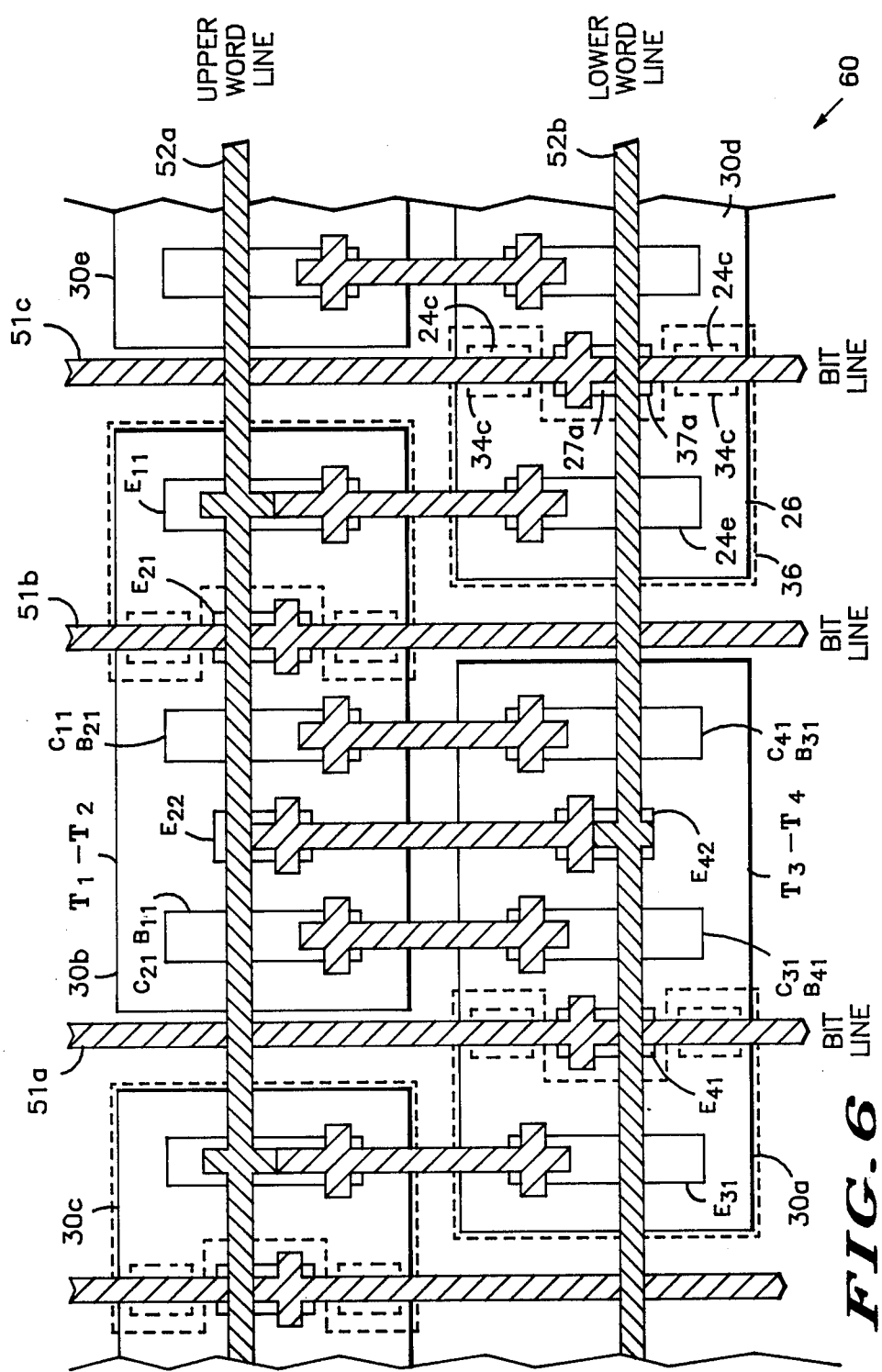
FIG. 6 shows a plan view in simplified and schematic form of the layout of the memory circuit of FIG. 4, according to a further embodiment of the present invention.

FIG. 6 shows a plan view in simplified form of the layout of memory cell 60 as a portion of an array according to a further embodiment of the present invention. FIG. 6 is generally similar to FIG. 5 but illustrating a more compact layout obtained by making buried P+ collector 26 u-shaped and placing P-plugs 24c adjacent to isolation walls 25. Mask outline 36 for P+ collector 26 and mask outline 34c for P-plugs 24c are shown in FIG. 6. P-base 24a and P-injector 24b have substantially the same shapes and locations as in FIGS. 3A-C hence their mask outlines are not shown in FIG. 6. Mask outline 37a for N+ emitter region 27a is shown in FIG. 6 as coincident with the emitter contact opening. Emitter region 27a is located in P region 24 between the arms of u-shaped collector 26 so as to be directly above N type collector 23 and buried N+ sub-collector 22. Other than aximuthal orientation, each SCR device 30a-e of FIG. 6 is identical.

EXAMPLE

The following is an example of the practice of the method of forming the above described structure. For convenience, the method will be described for the case where the devices are built on a P type substrate. However, this is not intended to be limiting and those of skill in the art will understand that the techniques described can be employed to construct equivalent structures on an N type substrate, but with appropriate substitution of dopant types.

Referring now to FIGS. 2A-C and 3A-C, substrate 21 is provided with N+ layer 22. This is conveniently accomplished by using an appropriate N type dopant. Arsenic or antimony are suitable. In a first embodiment of the method, a high concentration of P type dopant is then applied in the location of region 26. It is important to choose a dopant of comparatively high diffusivity for region 26. Boron is a typical high diffusivity P type dopant. N type layer 23 is then applied over regions 22 and 26. N type layer 23 is more lightly doped than regions 22 and 26. By virtue of its comparatively high concentration and high diffusivity, the P type dopant provided in the locations of region 26 propogates into N type region 23 while region 23 is being deposited, thereby forming P+ region 26. When using a P type substrate, region 23 is most conveniently formed as an N type epi-layer. The N epi-layer must have sufficient thickness to permit regions 24 and 27a-b to be subsequently formed therein without having portion 24b short to collector region 26. Following growth or deposition of the N epi-layer providing region 23, it is desirable to form isolation walls 25. Isolation walls 25 penetrate to substrate 21 and are desirably of a dielectric material. Means for forming such dielectric isolation walls are well known in the art.

P type regions 24a and 24b are formed in N type region 23, preferably at the same time. Ion implantation is a suitable means, but other well known doping techniques can also be used. N+ collector contact 22a is also formed in N type region 23. N+ emitters 27a-b and P+ contact areas 24d-e are formed in region 24 by means well known in the art. Ion implantation is a suitable means for forming any of these regions, although other doping techniques well known in the art can also be employed. Buried P plug 24c is preferably formed by ion implantation and may be formed any time after N region 23, but preferably after forming isolation walls 25.

In a second embodiment of the method of the present invention, buried P+ collector 26 is formed anytime after deposition of N type region 23, preferable by ion implantation at an energy sufficient to insure that the P type impurities are deposited at the desired depth under the surface of N type region 23. High energy ion implantation is also useful for providing plug 24c at the appropriate depth in the structure.

FIGS. 2A and 3A indicates mask outlines 32a, 34a-e, 35, 36, and 37a-b used to obtain device regions 22a, 24a-e, 25, 36, and 27a-b, respectively. FIG. 6 shows mask outlines 34c, 36, and 37a used to obtain regions 24c, 26, and 27a in that figure. Mask 34a for forming region 24a and mask 36 for forming region 26 overlap so that plug 24c which is formed using mask 34c may readily make contact to both layers. Mask 34c for forming plug 24c must not extend completely across the structure to as to intersect opposite isolation walls, since this would separate region 23 into two unconnected parts. The masks illustrated in FIGS. 2A and 3A produce plugs 24c approximately centrally located between opposing isolation walls 25. However, the P plug could equally well be composed of one or more P regions located anywhere between isolation walls 25 in the overlap between regions 24a and 26. It is only necessary that region 24c connect regions 24a and 26 without isolating portions 23a and 23b of region 23, i.e. there must exist somewhere in the overlap region N type portion 23c connecting N type portions 23a and 23b. For example, in FIG. 6, P-plug 24c is placed adjacent to isolation wall 25 with a gap between for portion 23c. In FIG. 6, portion 23c extends beneath emitter 27a. It will be understood by those of skill in the art that where region 25 is a dielectric isolation wall, that masks for regions which extend to the wall can overlap onto dielectric region 25. This substantially eases alignment requirements, since oversized masks can be used for a number of the device areas.

Having thus described the invention it will be apparent to those of skill in the art that substrate leakage current in the PNP device is reduced, as compared to prior art lateral devices, by virtue of the buried P+ collector of the vertical PNP of the present invention. The buried P+ collector of the PNP and the P base of the NPN overlap and are internally connected. Charge storage in the vertical PNP device of the present invention is reduced and switching times improved, as compared to SCRs using lateral devices. This is accomplished by reducing the volume of N type material in or adjacent to the base of the PNP transistor. It is further apparent that these improvements to the SCR device are accomplished within a single isolation tub and without use of intra-tub surface interconnection layers. Additionally, the layout of the SCR device of the present invention is compact and well suited for use in large memory arrays, and does not require additional process steps to provide for isolation of the individual devices making up the SCR.

Variations can be made upon the means and method of the present invention without departing from the spirit and intent of the present invention. For example, while the examples which have been given are for devices built on P type substrates, those of skill in the art will understand that the same principles as described herein are useful to build equivalent devices on N type substrates. Also, other device functions besides memories can be implemented using the same means and methods for forming the SCRs. Accordingly, it is intended to encompass such variations and equivalents within the claims that follow.

What is claimed is:
1. A monolithic semiconductor device formed in a monolithic semiconductor body, comprising:
  a vertical NPN transistor;
  a vertical PNP transistor adjacent to said vertical NPN transistor without an intervening isolation wall;
  wherein the collector of said vertical NPN and the base of said vertical PNP transistor are formed in a common N region and connected together within said semiconductor body by a portion of said common N region; and
  wherein the collector of said vertical PNP and the base of said vertical NPN are formed in separate P regions which have partially overlapping portions, and wherein the partially overlapping portions are internally connected within said monolithic semiconductor body.

2. A monolithic semiconductor device formed in a monolithic semiconductor body, comprising:
  a vertical PNP transistor;
  a vertical NPN transistor adjacent to said vertical PNP transistor without an intervening isolation wall;

wherein the collector of said vertical PNP and the base of said vertical NPN transistor are formed in a common P region and connected together within said semiconductor body by a portion of said common P region; and wherein the collector of said vertical NPN and the base of said vertical PNP are formed in separate N regions which have partially overlapping portions, and wherein the partially overlapping portions are internally connected within said monolithic semiconductor body.

3. A monolithic latching semiconductor device comprising:

a semiconductor substrate of a first conductivity type;

a first region of a second conductivity type different than said first type, overlying a portion of said substrate, and having first and second separated parts and a third part interconnecting said first and second parts;

a second region of said first conductivity type overlying a portion of said first region and having first and second separated parts;

a third region of said second conductivity type in said first part of said second region;

a fourth region of said first conductivity type in said first region, separated from said substrate and said second region and underlying said second part of said second region;

a fifth region of said first conductivity type interconnecting said first part of said second region and said fourth region; and wherein said first part of said first region underlies said first part of said second region, said second part of said first region separates said second part of said second region and said fourth region, and said third part of said first region lies between said first part of said second region and said fourth region.

4. The device of claim 3 wherein said third part of said first region is adjacent said fifth region.

5. The device of claim 3 further wherein said third region comprises separated first and second parts.

6. The device of claim 3 laterally circumscribed by a dielectric isolation wall contacting said first region.

7. The device of claim 3 wherein said fourth region is u-shaped and extends laterally on either side of said third region.

8. A semiconductor device having contacts on a single surface, comprising:

a substrate of a first conductivity type;

an isolation wall surrounding said device and extending to said substrate;

a multifunction region of a second conductivity type different than said first conductivity type, running laterally to said isolation wall, lying in contact with said substrate and extending to said surface, wherein said multifunction region has a relatively lightly doped first zone having a collector part, a base part, and a interconnection part, and wherein said interconnection part joins said collector part and said base part, and wherein said multifunction region has a relatively heavily doped second zone lying between said first zone and said substrate;

a first base of said first conductivity type overlying said collector part of said first zone of said multifunction region and extending to said surface;

a first emitter of said second conductivity type in said first base and extending to said surface;

a first injector of said first conductivity type in said base part of said first zone of said multifunction region and extending to said surface;

a second collector of said first conductivity type under said base part of said first zone of said multifunction region; and a coupling zone of said first conductivity type within said multifunction region, adjacent said interconnection part, and interconnecting said first base and said second collector.

9. The device of claim 8 wherein said second collector is u-shaped and extends laterally on either side of said first emitter.

* * * * *